(12) United States Patent
Isakharov et al.

(10) Patent No.: US 7,173,446 B2
(45) Date of Patent: Feb. 6, 2007

(54) MECHANISM TO STABILIZE POWER DELIVERED TO A DEVICE UNDER TEST

(75) Inventors: Arthur R. Isakharov, Hillsboro, OR (US); Isaac Chang, Subang Jaya (MY); Ai Ssa Chai, Sungai Petani (MY); Timothy M. Swettlen, Burlingame, CA (US)

(73) Assignee: Intel Corporation, Santa Clara, CA (US)

( * ) Notice: Subject to any disclaimer, the term of this patent is extended or adjusted under 35 U.S.C. 154(b) by 10 days.

(21) Appl. No.: 10/875,874

(22) Filed: Jun. 24, 2004

(65) Prior Publication Data

US 2005/0285613 A1    Dec. 29, 2005

(51) Int. Cl.
    *G01R 31/26*    (2006.01)

(52) U.S. Cl. ..................................... 324/765; 324/73.1
(58) Field of Classification Search .................. None
    See application file for complete search history.

(56) References Cited

U.S. PATENT DOCUMENTS 6,657,455 B2 *  12/2003  Eldridge et al. ............ 324/765
6,927,591 B2 *   8/2005  McCord ..................... 324/765

* cited by examiner

*Primary Examiner*—Minh N. Tang
(74) *Attorney, Agent, or Firm*—Blakely, Sokoloff, Taylor & Zafman LLP

(57) ABSTRACT

According to one embodiment a system is disclosed. The system includes a tester having a power supply, an integrated circuit device under test (DUT) and a transient compressor (TC) coupled between the tester and the power supply to stabilize power delivered to the DUT by injecting current into the path between the power supply and the DUT.

26 Claims, 4 Drawing Sheets

MECHANISM TO STABILIZE POWER DELIVERED TO A DEVICE UNDER TEST

FIELD OF THE INVENTION

The present invention relates to integrated circuits (ICs); more particularly, the present invention relates to the testing of ICs.

BACKGROUND

After an IC device is manufactured, and prior to its release, the device is typically tested. During testing, the device under test (DUT) has its power provided by a power supply and shunt decoupling. However, for a DUT to be properly tested, a stable voltage must be provided while testing.

The problem of providing a stable voltage becomes increasingly challenging with high transistor count and higher frequency DUTs. Conventional Sort Interface Unit (SIU) and Test Interface Unit (TIU) designs utilize a bank of power supplies accompanied by (decoupling) capacitors. Nonetheless the power supplies are located some electrical distance away on a tester. This distance coupled with the electrical parasitics of the SIU/TIU limit its response time to changes in power demand of the DUT. This lack of response time allows the power (which in turn is directly related to voltage) to sag or droop for a finite time period.

As devices increase in frequency, they demand more power in the form of more current. This increased current draw also happens over a short time. The higher current demand over shorter time periods will cause a voltage droop proportional to the impedance. With other test conditions fixed, the higher the test frequency, the larger the voltage droop due to higher currents and shorter time periods. For any specific product, there is a maximum voltage droop that can be tolerated under normal device operation. Voltage droop is a limiting factor for the power delivery capability of SIU/TIU.

BRIEF DESCRIPTION OF THE DRAWINGS

The present invention will be understood more fully from the detailed description given below and from the accompanying drawings of various embodiments of the invention. The drawings, however, should not be taken to limit the invention to the specific embodiments, but are for explanation and understanding only.

DETAILED DESCRIPTION

A mechanism to stabilize power delivered to a DUT is described. Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Figure 1:
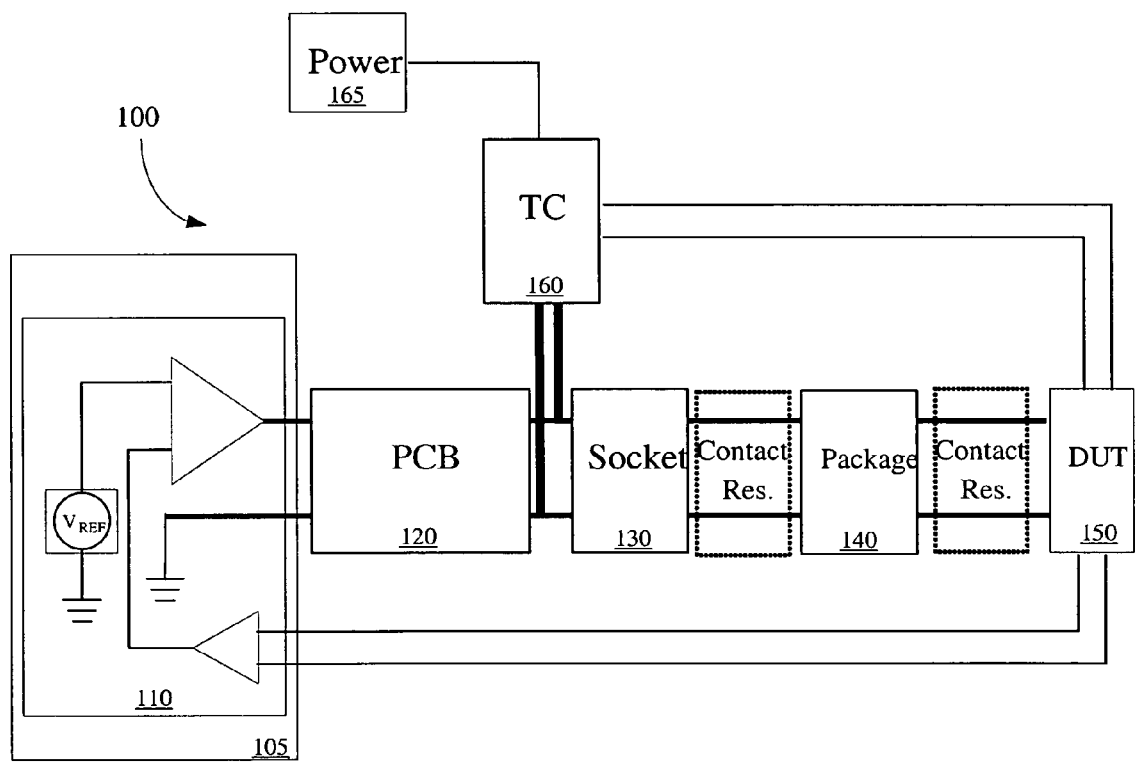
FIG. 1 illustrates one embodiment of a DUT testing system.

FIG. 1 is a block diagram of one embodiment of a system 100. System 100 includes a tester 105 having a power supply 110 coupled to a DUT 150 for testing. In between power supply 110 and DUT 150 are components including a printed circuit board (PCB) 120 on which is mounted a socket 130. The DUT is inserted within a package 140, which is in turn inserted within the socket 130. The socket 130-package 140 and package 140-DUT 150 connections have an associated contact resistance.

Figure 2:
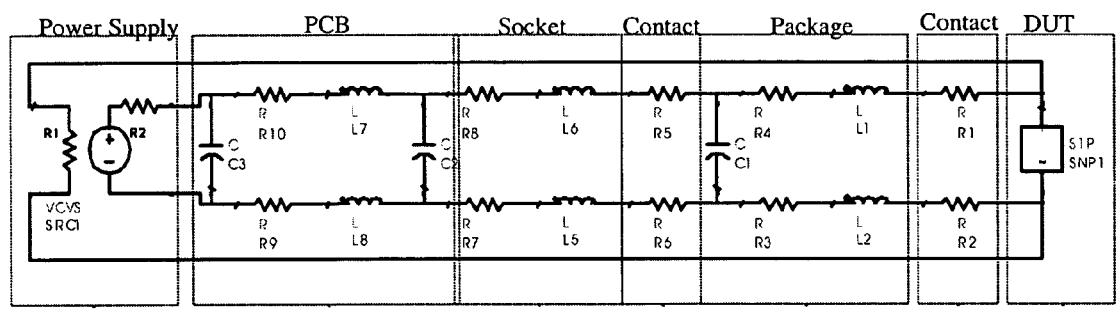
FIG. 2 illustrates one embodiment of an electrical schematic for an exemplary DUT testing system.

In addition, each component in the power supply 110 and DUT 150 path has an electrical effect on the circuit. For instance, FIG. 2 illustrates an electrical schematic of system 100. All of the circuit elements associated with the components in system 100 results in power supply 110 being located at a relatively far distance away from DUT 150, resulting in a limited response capability.

For example, when DUT 150 requires a significant amount of electrical current, the power path can fail to deliver power due to resistive loss and inductive delay. According to one embodiment, a transient compressor (TC) 160 is included to stabilize the power delivered to DUT 150. In one embodiment, TC 160 includes charge capacitors that have a close electrical proximity to DUT 150. The capacitors are charged by an external voltage source received from power supply 165. The charge capacitors provide an auxiliary capacitance (e.g., a capacitance charged with higher than system voltage). Thus, TC 160 capacitance is sourced voltage higher than system level such that di=C(dv/dt).

Moreover, TC 160 includes a sensor that receives feedback from DUT 1150 to detect when DUT 150 demands a large surge of power. If a surge of power is demanded, TC 160 will inject stored energy from the capacitors into the power delivery system DUT 150. The added stored energy will effectively offset any (resistive) loss or (inductive) delay in the system 100 path between DUT 150 and power supply 110.

Figure 3:
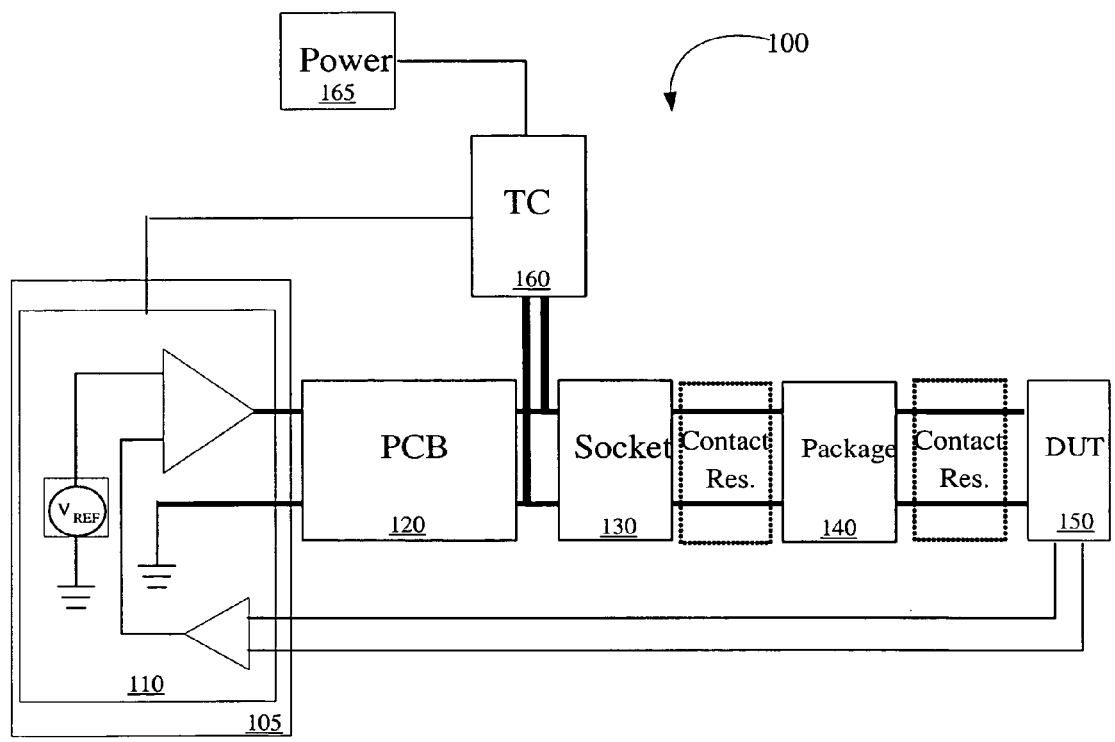
FIG. 3 illustrates another embodiment of a DUT testing system.

FIG. 3 illustrates another embodiment of system 100. In this embodiment, the injection of current is controlled by the tester. In such an embodiment, the DUT 150 feedback is received at power supply 110, which determines the voltage needed at DUT 150. If a surge of power is demanded, a signal is transmitted to TC 160.

Figure 4:
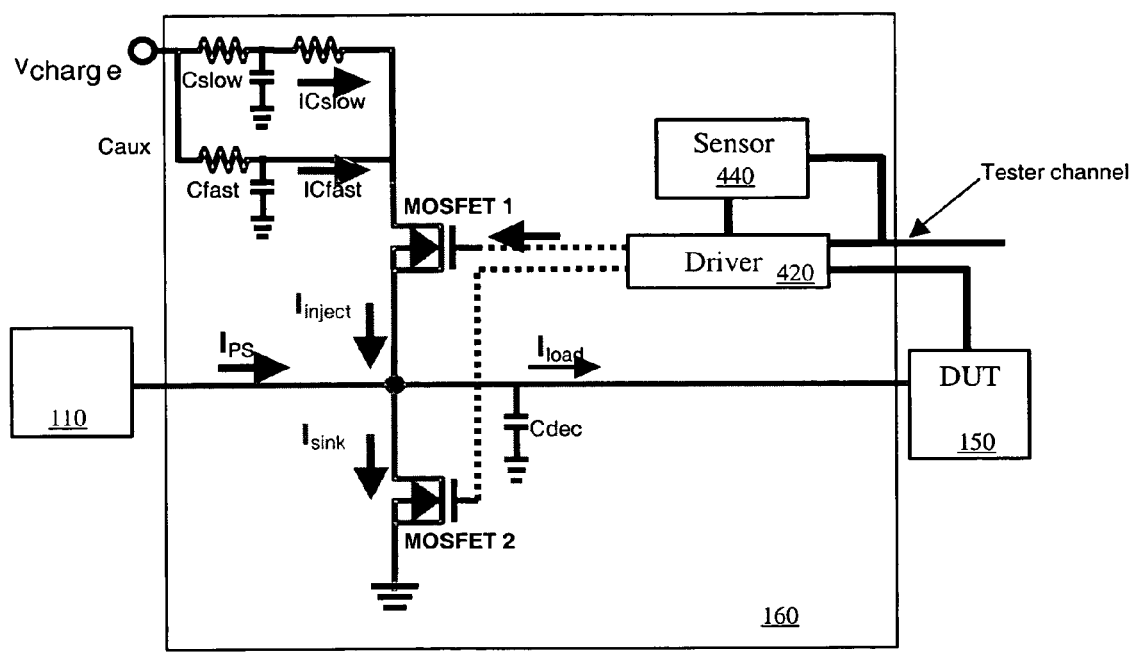
FIG. 4 illustrates one embodiment of a transient compressor.

FIG. 4 illustrates one embodiment of TC 160. TC 160 includes auxiliary capacitors ($C_{AUX}$), MOSFET transistors 1 and 2, driver 420 and sensor 440. Capacitors $C_{AUX}$ include capacitors in parallel ($C_{SLOW}$ and $C_{FAST}$) that are coupled to power supply 165. As discussed above, capacitors $C_{AUX}$ are charged at a higher voltage to provide the amount of charges that are required by DUT 150 during the very fast slew rate step up transient. Although described as MOSFET transistors, one of ordinary skill in the art will appreciate that transistors 1 and 2 may be implemented with other types of switching components.

Driver 420 generates a high current pulse that is transmitted to the transistors to increase response. Sensor 240 monitors the power level at DUT 150. Sensor 440 transmits a signal to driver 420 upon detecting that the power level at DUT 150 is above or below predetermined thresholds.

As DUT 150 changes state, an immediate large transient noise will be seen at DUT 150. TC 160 will provide additional energy ($I_{INJECT}$) during this changing state. The capacitors $C_{AUX}$ can be charged (Vcharge) above the operating voltage of system 100 to increase their energy storage ($E=C*V^2$). The energy can be switched in (MOSFET1) under control (e.g., by either a channel from the tester or via feedback from DUT 150 received at sensor 440).

When MOSFET1 is ON, $I_{LOAD}=I_{PS}+I_{INJECT}-I_{SINK}$ where $I_{SINK}=0$. By analyzing $I_{INJECT}$, it is evident that matching can be achieved by using two different RC networks as $C_{AUX}$, with different time constants. As a result of the networks, ICfast from a small capacitor (very low ESR/ESL) and ICslow from a bigger capacitor will deliver both the initial and remaining charges as $I_{INJECT}$.

Similarly, during the situations where there is excess energy in system 100, MOSFET2 could be switched to sink the current out from DUT 150 by shorting the decoupling capacitors to ground. This function is for removing extra dynamic charges/energy from DUT 150 when needed. The extra charges at the DUT may be the result of voltage overshoots.

The switching again can be controlled with either the tester channel or via feedback from DUT 160 to the sensor 440. In one embodiment, the MOSFETs are very fast (e.g., <10 ns) in order to remove energy from $I_{LOAD}$ since $I_{SINK}>0$. In this mode, $I_{INJECT}$ is zero (e.g., MOSFET1=OFF).

The implementation of TC 160 enables a SIU/TIU to meet the sub-volt and high (current) power requirement for all upcoming microprocessors. In addition, TC 160 will help to reduce a considerable number of additional capacitors, and the development cost for an ultra low contactor.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the invention.

What is claimed is:

1. A system comprising:
   a tester having a power supply;
   an integrated circuit device under test (DUT); and
   a transient compressor (TC) including:
      a sensor to monitor a power level at the DUT;
      one or more capacitors to store charge from an external voltage source; and
      a driver coupled to the sensor to cause the one or more capacitors to inject current into the path between the power supply and the DUT whenever the sensor detects that the DUT has a power demand, and to sink excess current to ground whenever the sensor detects that the DUT has excess power.

2. The system of claim 1 wherein the injected current maintains a constant voltage at the DUT and offsets resistive loss and inductive delay in the path between the power supply and the DUT.

3. The system of claim 1 wherein the TC comprises,
   a first transistor to inject the current upon being activated by the driver;
   a second transistor to sink the current upon being activated by the driver.

4. The system of claim 3 wherein the one or more capacitors include first and second capacitors arranged in parallel.

5. The system of claim 4 wherein the one or more capacitors have a close electrical proximity to the DUT.

6. The system of claim 3 wherein the one or more capacitors are charged at a voltage higher than the power supply.

7. The system of claim 3 wherein the sensor activates the driver upon detecting that the DUT has a voltage above a predetermined threshold.

8. The system of claim 7 wherein the driver activates the first transistor upon the sensor detecting that the DUT has a voltage below the predetermined threshold.

9. The system of claim 8 wherein the first transistor injects the current into the path between the power supply and the DUT.

10. The system of claim 7 wherein the driver activates the second transistor upon the sensor detecting that the DUT has a voltage above the predetermined threshold.

11. The system of claim 10 wherein the second transistor sinks the current from the path between the power supply and the DUT.

12. The system of claim 3 further comprising a channel coupled between the tester and the TC, to transmit the power level of the DUT to the TC.

13. A method comprising:
    receiving an indication that an integrated circuit device under test (DUT) has a voltage above or below a predetermined threshold;
    activating a driver;
    injecting current from charged capacitors into the path between the DUT and a tester upon the driver being activated if the DUT has a voltage below the predetermined threshold; and
    sinking current from the path between the DUT and the tester if the DUT has a voltage above the predetermined threshold.

14. The method of claim 13 wherein injecting current into the path between the DUT and the tester comprises the driver activating a first transistor coupled to the charged capacitors.

15. The method of claim 14 further comprising the injected current maintaining a constant voltage at the DUT while offseting resistive loss and inductive delay in the path between a power supply and the DUT.

16. The method of claim 14 wherein sinking current from the path between the DUT and the tester comprises the driver activating a second transistor coupled to ground.

17. A transient compressor (TC) comprising:
    a sensor to monitor a power level at the DUT;
    one or more capacitors to store charge from an external voltage source; and
    a driver coupled to the sensor to cause the one or more capacitors to inject current into the path between a power supply and the DUT whenever the sensor detects that the DUT has a power demand, and to sink excess current to ground whenever the sensor detects that the DUT has excess power.

18. The transient compressor of claim 17 wherein the injected current offsets resistive loss and inductive delay in the path between the power supply and the DUT.

19. The transient compressor of claim 17 wherein the one or more capacitors include first and second capacitors arranged in parallel.

20. The transient compressor of claim 19 wherein the one or more capacitors have a close electrical proximity to the DUT.

21. The transient compressor of claim 17 wherein the one or more capacitors are charged at a voltage higher than the power supply.

22. The transient compressor of claim 17 wherein the TC further comprises,
  a first transistor to inject the current upon being activated by the driver;
  a second transistor to sink the current upon being activated by the driver.

23. The transient compressor of claim 22 wherein the sensor activates the driver upon detecting that the DUT has a voltage above or below a predetermined threshold.

24. The transient compressor of claim 23 wherein the driver activates the first transistor upon the sensor detecting that the DUT has a voltage below the predetermined threshold.

25. The transient compressor of claim 24 wherein the first transistor injects the current into the path between the power supply and the DUT.

26. The transient compressor of claim 17 further comprising a channel coupled between a tester and the TC, to transmit the power level of the DUT to the TC.

* * * * *